United States Patent
Luetzen et al.

(10) Patent No.: US 6,541,334 B2
(45) Date of Patent: Apr. 1, 2003

(54) INTEGRATED CIRCUIT CONFIGURATION HAVING AT LEAST ONE BURIED CIRCUIT ELEMENT AND AN INSULATING LAYER, AND A METHOD OF MANUFACTURING THE INTEGRATED CIRCUIT CONFIGURATION

(75) Inventors: Jörn Luetzen, Dresden (DE); Bernhard Sell, Dresden (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 09/891,188

(22) Filed: Jun. 25, 2001

(65) Prior Publication Data

US 2002/0005538 A1 Jan. 17, 2002

(30) Foreign Application Priority Data

Jun. 23, 2000 (DE) .......................... 100 30 696

(51) Int. Cl.⁷ .......................... H01L 21/8242
(52) U.S. Cl. .................. 438/243; 438/246; 438/386
(58) Field of Search .................. 438/243, 244, 438/246, 248, 386, 387, 389, 391; 257/301, 302, 304

(56) References Cited

U.S. PATENT DOCUMENTS

| 5,336,912 A | * | 8/1994 | Ohtsuki | 257/301 |
| 5,442,211 A | * | 8/1995 | Kita | 257/301 |
| 6,297,088 B1 | * | 10/2001 | King | 438/243 |

FOREIGN PATENT DOCUMENTS

EP  0 709 900 A2  5/1996

* cited by examiner

*Primary Examiner*—Long Pham
*Assistant Examiner*—Hoai Pham
(74) *Attorney, Agent, or Firm*—Laurence A. Greenberg; Werner H. Stemer; Gregory L. Mayback

(57) ABSTRACT

The integrated circuit configuration has at least one buried circuit element and an insulating layer. A multiplicity of insulating regions are in contact with one another to forming a locally delimited insulating layer in the substrate. In this way, trench capacitors implemented as buried circuit elements can be manufactured with a structure size of less than 100 nm in a simple and cost-effective manner.

9 Claims, 6 Drawing Sheets

US 6,541,334 B2

INTEGRATED CIRCUIT CONFIGURATION HAVING AT LEAST ONE BURIED CIRCUIT ELEMENT AND AN INSULATING LAYER, AND A METHOD OF MANUFACTURING THE INTEGRATED CIRCUIT CONFIGURATION

BACKGROUND OF THE INVENTION

Field of the Invention

The invention lies in the integrated technology field. More specifically, the present invention relates to an integrated circuit configuration which is arranged in a substrate and has at least one buried circuit element, and to an associated manufacturing method, and in particular to a DRAM memory with buried trench capacitors.

Integrated semiconductor memory circuits with such trench capacitors are, for example, memories with random access (RAM), dynamic memories (DRAM, dynamic random access memory), synchronous dynamic memories (SDRAM), and chips which combine logic functions and dynamic memories and are referred to as embedded DRAMs.

In order to illustrate the present invention, conventional trench capacitors such as are found, for example, in dynamic memories DRAMs will firstly be described.

FIG. 1 shows a conventional trench capacitor such as is used in particular in a DRAM semiconductor memory cell. Such a DRAM semiconductor memory cell is composed essentially of a capacitor 160 which is formed in a substrate 101. The substrate is lightly doped with, for example, p-type dopants such as boron. A deep trench which is formed in the substrate is usually filled with polysilicon 161 which is heavily n+ doped with, for example, arsenic or phosphorus. A buried plate 165 which is doped with, for example, arsenic is located within the substrate 101 on a lower region of the trench. The arsenic or the dopant is usually diffused out into the silicon substrate 101 from a dopant source such as an arsenic silicate glass (ASG) which is formed on the side walls of the trench (temporarily for the doping process). The polysilicon 161 and the buried plate 165 serve here as electrodes of the capacitor 160. A dielectric layer 164 separates the electrodes of the capacitor and serve as a capacitor dielectric.

In order to actuate the trench capacitor 160, the DRAM semiconductor memory cell according to FIG. 1 also has a selection transistor 110. The transistor has a gate 112 and diffusion regions 113 and 114. The diffusion regions which are spaced apart by a channel 117 are usually formed by implanting dopants, for example phosphorus. A contact diffusion region 125 connects the capacitor 160 to the selection transistor 110 in the process.

An insulating collar 168 is formed on an upper section or upper region of the trench. The insulating collar 168 prevents a leakage current to the diffusion region 125 in contact with the buried plate 165. Such a leakage current is undesirable in particular in memory circuits because it reduces the charge holding time or retention time of a semiconductor memory cell.

According to FIG. 1, the conventional semiconductor memory cell with trench capacitor also has a buried well or layer 170. The peak concentration of the dopants in the buried n-type well are located approximately at the lower end of the insulating collar 168. The buried well or layer 170 serves essentially to connect the buried plates 165 of a multiplicity of adjacent DRAM semiconductor memory cells or capacitors 160 in the semiconductor substrate 101.

Switching the selection transistor 110 by applying a suitable voltage to the gate 112 essentially permits access to the trench capacitor 160, the word line usually simultaneously forming the gate at every second cell. FIG. 1 thus shows an active word line 112 and a passive word line 120. The diffusion region 113 is connected to a bit line 185 in the DRAM field. The bit line 185 is separated from the diffusion region 113 by a dielectric insulating layer 189 and is electrically connected to it via a contact 183.

In addition, in order to insulate a respective semiconductor memory cell with associated trench capacitor from the adjacent cells, shallow trench isolation (STI) 180 is formed on the surface of the semiconductor substrate 101. According to FIG. 1, what is referred to as the passing word line 120 (adjacent) can for example be formed above the trench, isolated by the shallow trench isolation 180, providing what is referred to as a folded bit line architecture.

In this way, a conventional semiconductor memory cell which is suitable for highly integrated circuits is obtained. A disadvantage with such semiconductor memory cells is, however, the use of the insulating collar 168, in particular in the case of greater integration or further shrinking. In order to avoid parasitic vertical field effect transistors and to raise a switch-on voltage above the operating voltage, this insulating collar 168 will in future generations also have to have a minimum thickness which is dependent on the respective operating voltage. For this reason, it is difficult to scale this conventional trench capacitor to, for example, structure sizes of less than 100 nm when the circuit elements are arranged according to the prior art. To be more precise, the upper region of the trench becomes a problem area and leads to an increased series resistance, and in extreme cases to choking off of the internal electrode of the capacitor.

In order to avoid this problem, the art has provided a further semiconductor memory cell with trench capacitor. The conventional memory cell, which is illustrated in FIG. 2, is formed, for example, in an SOI substrate (silicon on insulator). Such a conventional trench capacitor is known, for example, from U.S. Pat. No. 5,770,484 (see EP 0 848 418 A2). Identical reference symbols designate here identical layers or elements to those in FIG. 1, and a detailed description is dispensed with for reasons of simplicity.

The essential difference from the trench capacitor illustrated in FIG. 1 is essentially the substrate used, which comprises what is referred to as an SOI substrate. Here, according to FIG. 2 there is an insulating layer 190 on a carrier substrate 101, and a semiconductor substrate 200 over the insulating layer 190. Owing to the use of such a substrate, the selection transistor 110 is completely electrically isolated from the trench capacitor 160, preventing any parasitic vertical transistors from being formed. The use of a collar can be completely dispensed with here, as a result of which a greater integration capacity or further shrinking is possible. A disadvantage with such a conventional SOI trench capacitor is, however, the extraordinarily high manufacturing costs which result in particular from the provision of the expensive SOI substrate. It would also be desirable to be able to form the buried insulating layer only locally in order to permit simpler integration into the current process.

SUMMARY OF THE INVENTION

The object of the present invention is to provide an integrated circuit configuration with at least one buried circuit element and a manufacturing method which overcomes the above-noted deficiencies and disadvantages of the prior art devices and methods of this general kind, and which can be implemented even for structures of less than 100 nm in a simple and cost-effective fashion.

With the above and other objects in view there is provided, in accordance with the invention, an integrated circuit configuration, comprising:

a substrate having a surface;

at least one circuit element formed in the substrate near the surface;

at least one buried circuit element formed in the substrate and spaced apart from the circuit element near the surface; and an insulating layer locally delimited in the substrate and disposed between the circuit element near the surface and the buried circuit element.

With the above and other objects in view there is also provided, in accordance with the invention, a method of manufacturing an integrated circuit configuration with at least one buried circuit element. The method comprises the steps of:

forming a multiplicity of trenches in a substrate;

forming an outer conductive layer on lower regions of the trenches within the substrate, defining first capacitor plates;

forming dielectric layers in the trenches, defining capacitor dielectrics;

forming an inner conductive layer in the trenches, defining second capacitor plates; and producing a multiplicity of insulating regions in contact with one another on wall sections of the trenches above the outer conductive layer.

In particular by forming a multiplicity of insulating regions which are in contact on wall sections of the trenches above an outer conductive layer, a continuous insulating layer which reliably isolates circuit elements near to the surface or selection transistors from associated buried circuit elements or trench capacitors and thus obviates the need for insulating collars is formed by using a conventional cost-effective substrate. As a result, greater integration or further shrinking is made possible even when using very cost-effective substrate materials. In addition, the dependence on the operating voltages and the properties of the materials used is eliminated, allowing in some cases critical process parameters to be relaxed. The insulating regions which are in contact between the selection transistor and trench capacitor thus eliminate the presence of a parasitic vertical transistor by inserting a continuous insulating layer, the electrical isolation of the opposite electrode of the capacitance of, for example, the semiconducting region of the selection transistor being complete. This isolation can be produced locally on specific parts of the chip, which favors the linking of memory cells and logic circuits.

In addition to the reduced overall process complexity owing to the absence of the insulating collar process and to a reduced series resistance with respect to the electrode in the trench, in addition increased capacitance is obtained at the same trench depth as a result of the smaller length of the insulating region which does not contribute to the capacitance.

A lower region of the trenches can preferably be expanded to form a bottle shape, as a result of which the capacitance is increased further. However, alternatively or in addition surface-enlarging methods such as HSG or a mesopore forming process can also be used, as a result of which the surface roughness within the trench is increased, and the surface and the capacitance are thus made larger.

Other features which are considered as characteristic for the invention are set forth in the appended claims.

Although the invention is illustrated and described herein as embodied in an integrated circuit configuration having at least one buried circuit element and an insulating layer, and a method for manufacturing it, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 3A:
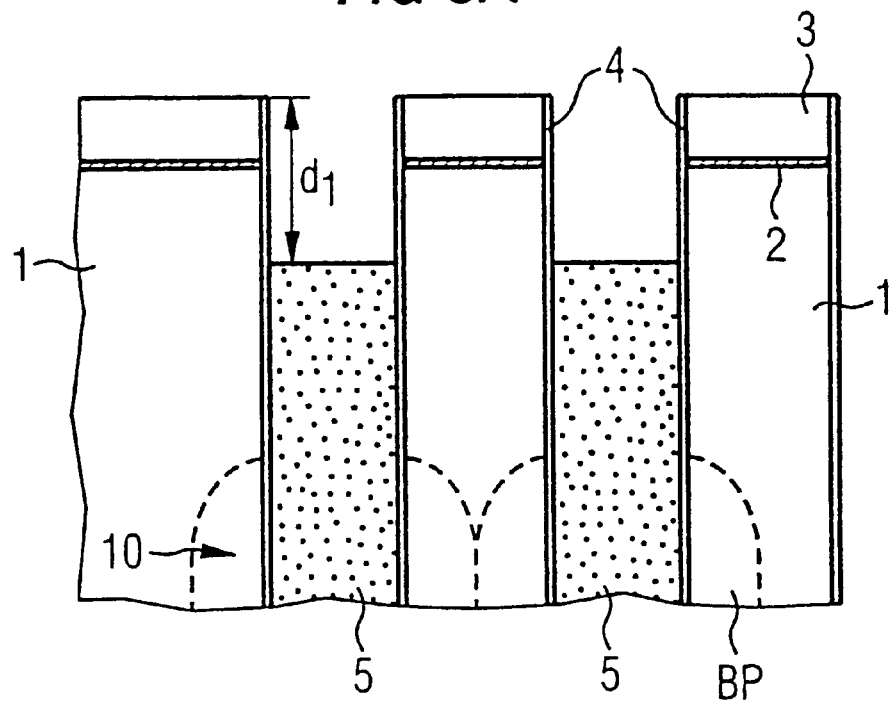
FIGS. 3A to 3F are simplified sectional views illustrating the respective method steps for manufacturing a multiplicity of trench capacitors in an integrated circuit configuration according to a first exemplary embodiment of the present invention.

Referring now once more to the figures of the drawing in detail and first, particularly, to FIG. 3A thereof, a multiplicity of (deep) trenches 10 are firstly formed in a conventional substrate 1, for example an Si semiconductor substrate. To be more precise, for example a pad oxide layer 2 and a pad nitride layer 3 are formed as mask layer on the substrate 1. Photolithographic patterning with subsequent exposure or etching of the trenches 10 in the substrate 1 is carried out using this mask layer with additional hard mask layers, for example a BSG layer, a nitride layer and a polysilicon layer (not illustrated).

The deep trenches 10 are preferably formed by way of reactive ion etching (RIE), however any other further anisotropic etching methods can also be used. A lower region of the trenches can optionally be widened (not illustrated) in order to form a bottle shape, permitting a significant increase in the capacitance to be achieved. Such widening is achieved for example by using an additional mask layer inside the trench 10 by means of an isotropic etching, the substrate 1 being removed in the lower region of the trench 10 selectively with respect to the mask layer (not illustrated). In order to widen the trench 10 in the lower region it is possible, for example, to use an $NH_4OH$ wet etching method, a KOH wet etching method or an isotropic dry etching method.

As an alternative to, or in addition to such an enlargement of the trench 10 and an associated increase in the capacitance, it is also possible to apply surface-enlarging methods, for example HSG or the formation of mesopores to the inner walls of the trenches, which further improve the capacitance. In these methods, a surface of the trench is enlarged significantly by, for example, applying small Si spheres or finely structured roughening of the inner walls. Such capacitance-increasing methods permit, in particular, capacitances with structure sizes of less than 100 nm to be implemented, thus permitting greater integration of memory circuits.

In addition, according to FIG. 3A, one or a multiplicity of outer conductive layers or buried plates Bp are formed on the lower regions of the trenches 10 within the substrate 1 as first capacitor plate/plates. The buried plates BP can be formed, for example, by diffusing out of a highly doped, temporarily applied layer (ASG, PSG) or by means of gas phase doping. In the case of gas phase doping, the buried plates BP are formed using, for example, $AsH_3$ or $PH_3$ at a temperature of 900 to 1100° C. Celsius. However, in the same way it is also possible to dope from an ASG or PSG (arsenic or phosphorus silicate glass) layer in the trench 10.

In addition, according to FIG. 3A a dielectric layer 4, which acts as a capacitor dielectric, is formed on the inner walls of the trenches 10. In addition to nitride/oxide, dielectric materials with a high relative dielectric constant, for example $Al_2O_3$, $TiO_x$ etc. can also be formed for this dielectric layer 4, as well as a combination with suitable metal electrodes; MIS, metal insulator semiconductor; MIM, metal insulator metal. Finally, an inner conductive layer 5 is formed, as second capacitor plate, on this dielectric layer 4 in the trenches 10. Preferably, the inner conductive layer 5 is composed of a highly doped polysilicon layer which completely fills the trenches 10. When the inner conductive layer 5 is made to penetrate down to a first predetermined depth $d_1$ into the trench 10, the trench structure illustrated in FIG. 3A is obtained, as a result of which a trench capacitor or a buried circuit element is formed. The predetermined depth $d_1$ has, for example, a value of approximately 500 nm.

Figure 3B:
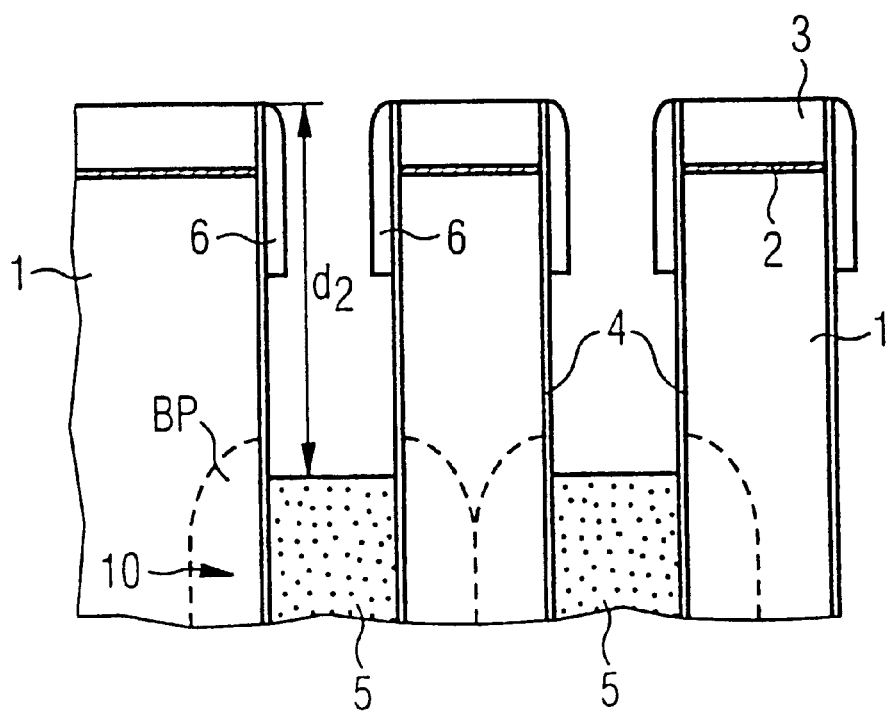

In the further method steps according to FIG. 3B, an insulating mask 6 is subsequently formed in the depressions in the trenches 10, to the first predetermined depth $d_1$. This insulating mask 6 is preferably composed of an $Si_3N_4$ layer. In order to expose the electrically conductive inner layer 5, the lower part of the insulating mask 6 is then preferably removed by anisotropic etching and the inner conductive layer 5 is etched back further to a predetermined depth $d_2$. This further downward extension of the inner conductive layer 5 into the trench 10 to a depth of approximately 1000 nm is preferably carried out by using the insulating mask 6 and the dielectric layer 4 as mask. In a further method step which is not illustrated in FIG. 3B, the exposed dielectric layer 4 is removed using the insulating mask 6 and the inner conductive layer 5, for example by means of a wet etching method, as a result of which the semiconductor substrate 1 is exposed to a predetermined depth $d_1$, to $d_2$ starting from the trenches 10.

Figure 3C:
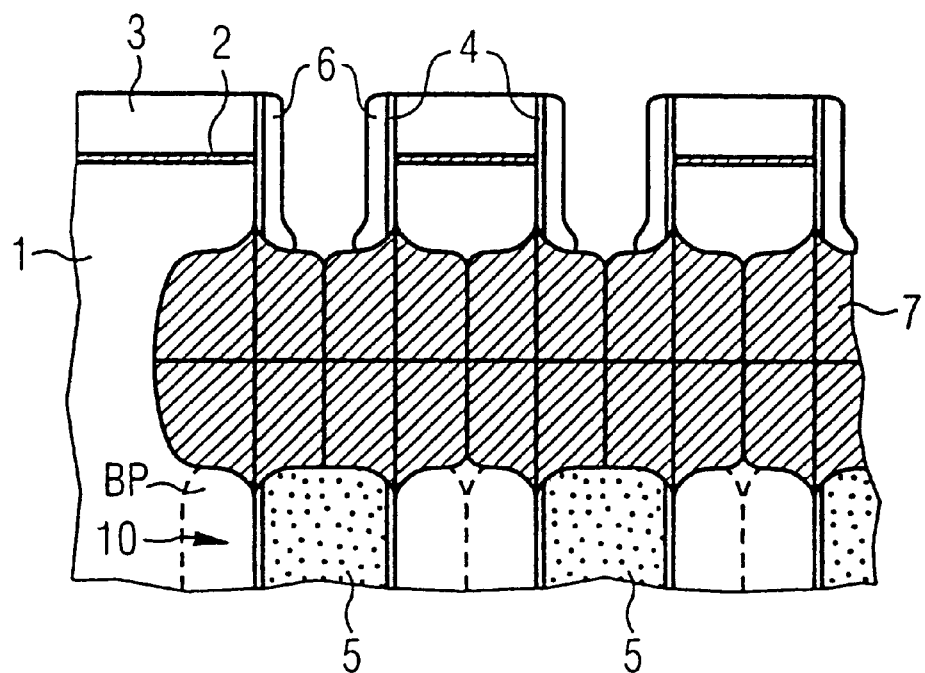

According to FIG. 3C, in the following steps a multiplicity of insulating regions 7 which are in contact are formed on the exposed wall sections of the trenches 10 above the buried plates BP. To be more precise, the trench walls from which the dielectric layer 4 is removed are preferably thermally oxidized to such an extent that the silicon which is present there is converted into silicon dioxide. Owing to the growth in volume with such thermal oxidation, after a predetermined time not only is contact formed between the insulating regions 7 and adjacent trenches 10 but the respective trenches 10 are also (at least partially) constricted. If structure sizes of less than 100 nm are used, the typical thickness of such insulating regions 7 is approximately 200 nm. By virtue of the fact that parts of the substrate are covered with a nitride barrier during the thermal oxidation, the silicon is oxidized only locally, that is to say what is referred to as a LOCOS method, for example, is used. Owing to the insulating regions 7 which are in contact, an insulating layer is obtained which extends parallel to the surface, is delimited locally and is comparable to an SOI substrate, but can be manufactured significantly more cost-effectively. A significant advantage when forming such an insulating layer is particularly the fact that it can be combined with virtually all standard processes and does therefore not require any additional or particular process sequences. As a result of the fact that it is delimited locally it is possible to form the insulating layer only in the cell field of an integrated circuit, so that the logic part of this circuit does not need to be modified.

Figure 3D:
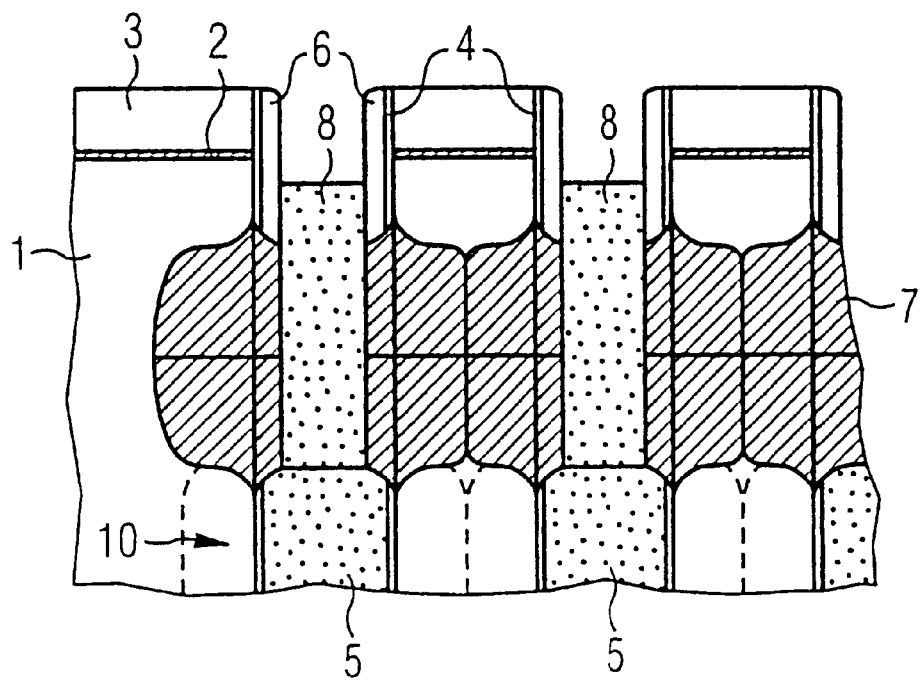

According to FIG. 3D, in a following method step using the slightly raised insulating mask 6, the insulating regions 7 are removed at least in a portion of the trenches 10 in order to expose the internal conductive layer 5. An anisotropic etching method such as RIE (reactive ion etching) is again preferably used for this. After this channel is formed in the trenches 10, the exposed trenches are filled again with a conductive filler material 8. This conductive filler material 8 is again preferably composed of a highly doped polysilicon. The filler material 8 which is filled in is then again made to penetrate down to a predetermined depth. The series resistance of the electrode in the trench can thus be reduced further in comparison with the conventional collar process owing to the fact that the diameter is not reduced.

Figure 3E:
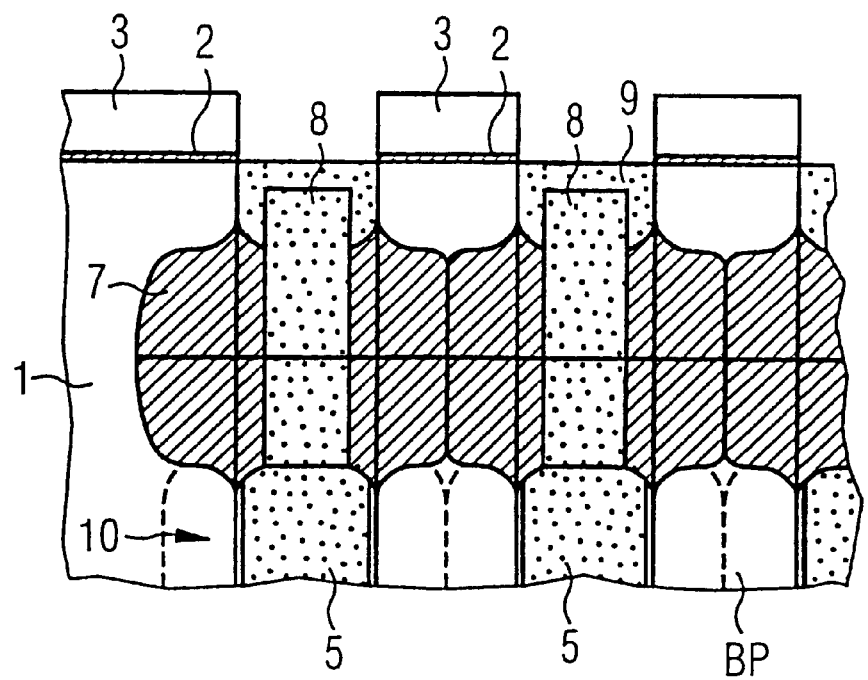

In a following step according to FIG. 3E, a conductive bridge 9 is formed above the insulating regions 7 on the conductive filler material 8, for which, for example, polysilicon with particularly high doping is again used. Owing to the high doping, a particularly low resistance with respect to the adjacent semiconductor substrate 1 is obtained, which is essential for later making contact with the selection transistors or circuit elements which are near to the surface.

Figure 1:
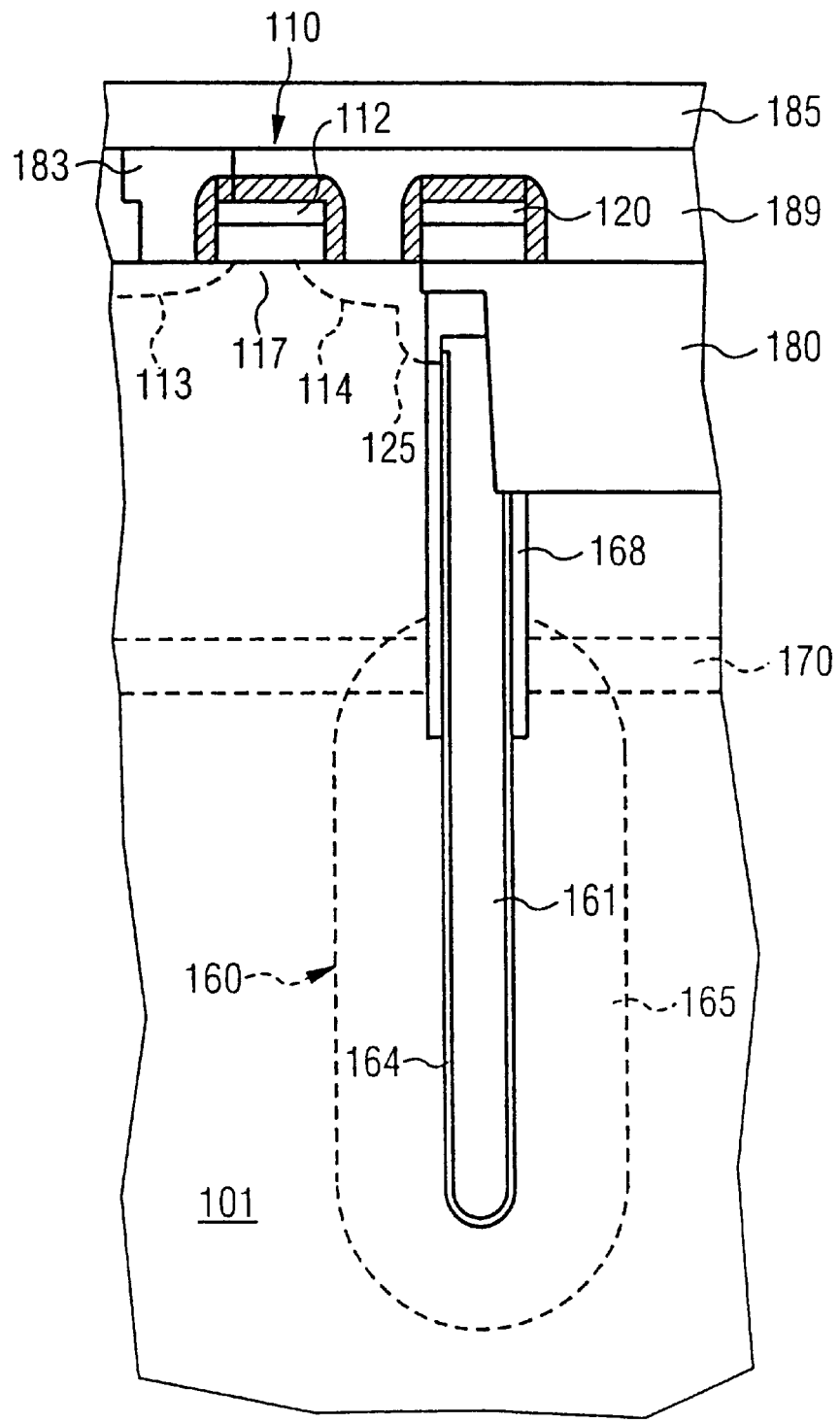
FIG. 1 is a simplified sectional view of a semiconductor memory cell with a trench capacitor according to the prior art.
Figure 2:
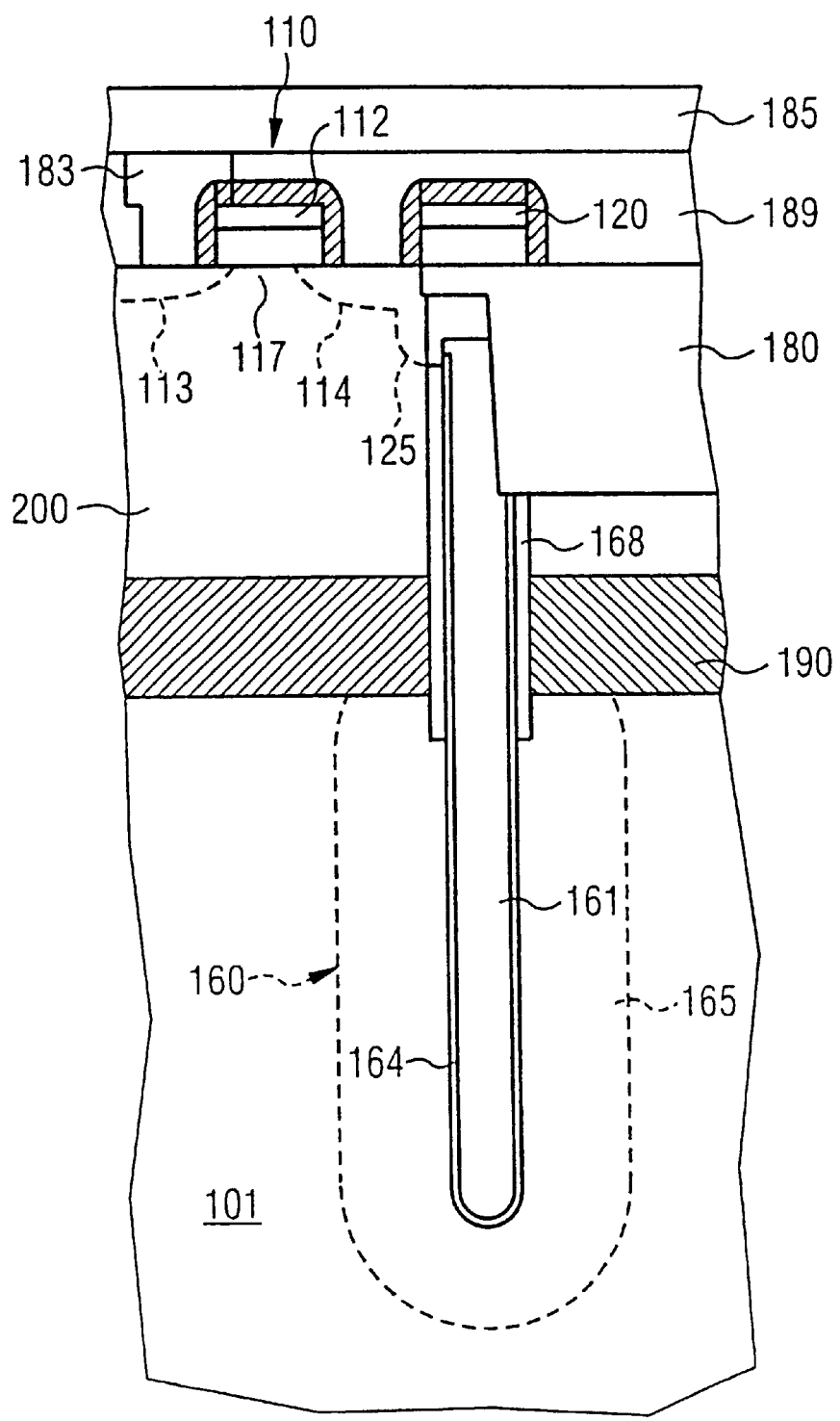
FIG. 2 is a simplified sectional view of a further semiconductor memory cell with a trench capacitor according to the prior art.
Figure 3F:
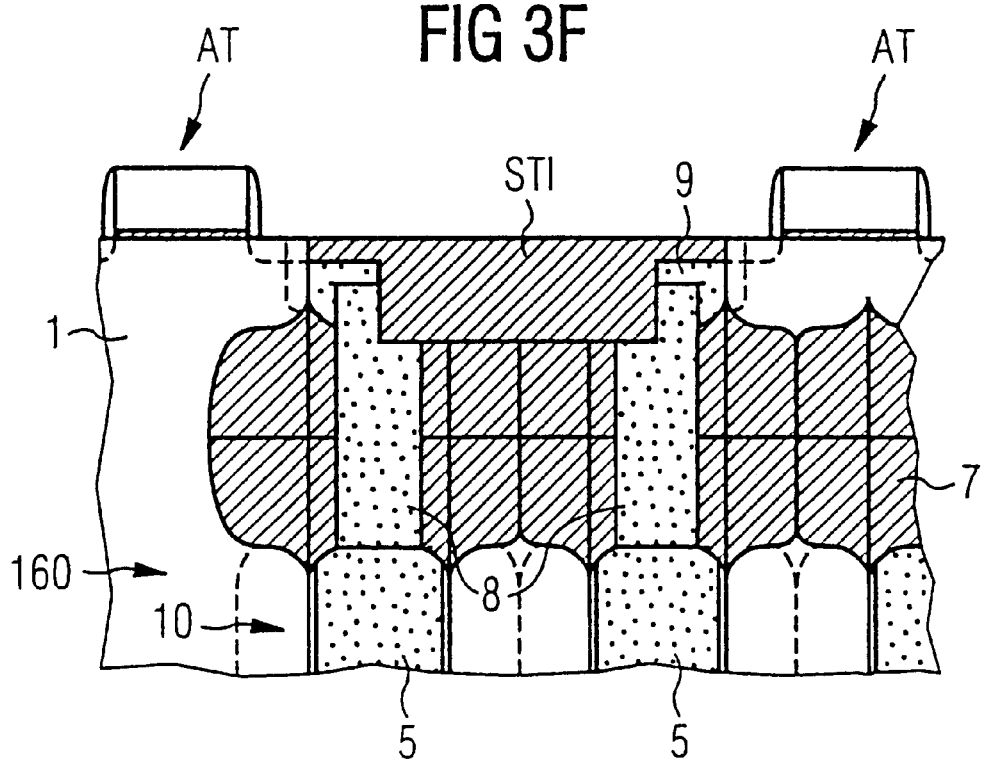

FIG. 3F shows a simplified sectional view of a semiconductor memory cell with trench capacitor according to the present invention, shallow trench isolation STI being formed as in the prior art according to FIGS. 1 and 2 before the pad nitride layer 3 and the pad oxide layer 2 are removed. Then, the circuit elements or selection transistors AT which are near to the surface are formed at the surface of the substrate 1. The shallow trench isolation STI serves here to isolate the adjacent circuit elements or selection transistors which are near to the surface, the selection transistors AT being used to selectively actuate the respective trench capacitors. A detailed description of the method steps for manufacturing these further layers or elements is not provided at this point because they are sufficiently known to those of skill in the pertinent art.

Figure 4:
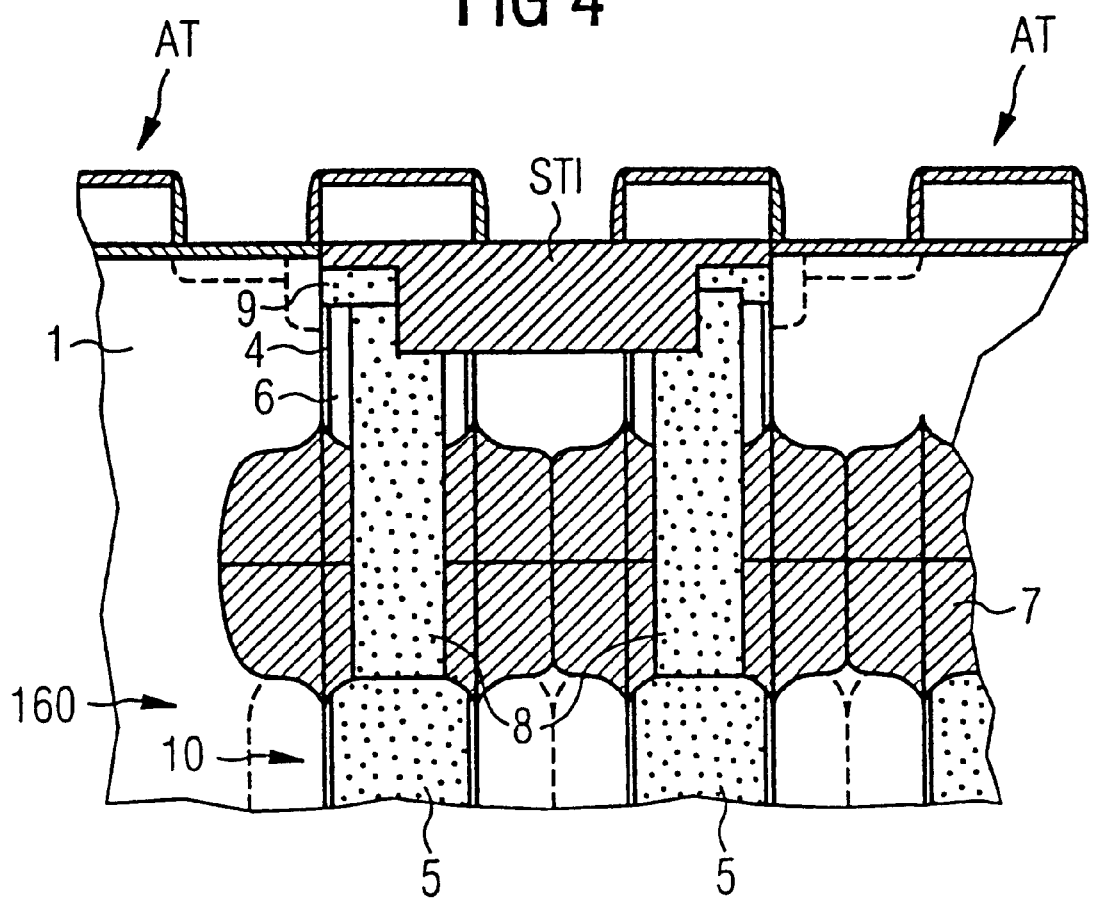
FIG. 4 is a simplified sectional view of an integrated circuit configuration according to a second exemplary embodiment of the present invention.

FIG. 4 shows a simplified sectional view of an integrated circuit configuration according to a second exemplary embodiment of the present invention. Similar and functionally equivalent layers and elements are identified with the same reference symbols as in FIG. 3F, and no repeated description is provided below.

According to FIG. 4, in contrast to the first exemplary embodiment described above, the dielectric layer 4 and/or the insulating mask 6 can be retained in the upper region of the trench 10, providing additional insulation with respect to the substrate region near to the surface. The requirements made of the shallow trench isolation STI are thus heightened and a substrate region which is near to the surface and has a greater thickness is made possible. The locally delimited insulating regions 7 can thus be formed at any desired depth within the substrate 1, which is preferably composed of monocrystalline semiconductor substrate.

In this way, an integrated circuit configuration is obtained which has at least one buried circuit element, together with an associated manufacturing method which can be applied to structure sizes of less than 100 nm without problems. In addition, significant cost savings are obtained because it is possible to use a conventional monocrystalline substrate which, in contrast to an SOI substrate, is very cost-effective. At the same time, owing to the insulating regions 7 which are in contact, parasitic vertical transistors are excluded, for which reason no leakage currents occur in this region and the retention time or charge holding time is increased. Owing to the absence of an insulating collar, the entire process complexity can be significantly simplified. Owing to the absence of an insulating collar, the diameter in the upper region of the trench capacitor is also increased, for which reason a reduced series resistance with respect to the electrode in the trench is obtained. In addition to surface-enlarging and capacitance-increasing methods, the capacitance is further increased, with the same trench depth, by virtue of the smaller length of the (insulating) region of the trench which does not contribute to the capacitance because the insulating regions which are in contact constitute very good insulation in the vertical direction.

The present invention is described above with particular reference to a DRAM semiconductor memory cell. However, it is not restricted thereto and rather comprises all further integrated circuits wherein circuit elements which lie vertically one above the other in the substrate have to be completely electrically insulated.

We claim:

1. A method of manufacturing an integrated circuit configuration with at least one buried circuit element, which comprises the steps of:

forming a multiplicity of trenches in a substrate;

forming an outer conductive layer on lower regions of the trenches within the substrate, defining first capacitor plates;

forming dielectric layers in the trenches, defining capacitor dielectrics;

forming an inner conductive layer in the trenches, defining second capacitor plates; and producing a multiplicity of insulating regions in contact with one another on wall sections of the trenches above the outer conductive layer, the producing step including:

forming an insulating mask in the trenches to a first predetermined depth;

causing the inner conductive layer to penetrate down further to a second predetermined depth;

removing the dielectric layer using the insulating mask and the inner conductive layer as a mask; and converting the substrate on the wall sections of the trenches at least until resulting insulating regions of adjacent trenches are in contact.

2. The method according to claim 1, which comprises:

forming the inner conductive layer by filling the trenches with the inner conductive layer; and causing the inner conductive layer to penetrate down into the trenches to a first predetermined depth.

3. The method according to claim 1, wherein the producing step comprises carrying out thermal oxidation.

4. The method according to claim 1, wherein the producing step comprises carrying out a LOCOS method.

5. The method according to claim 1, which further comprises enlarging a surface of the trenches.

6. The method according to claim 1, which comprises forming the outer conductive layer by diffusing out from a temporarily applied layer.

7. The method according to claim 1, which comprises forming the outer conductive layer by gas phase doping.

8. A method of manufacturing an integrated circuit configuration with at least one buried circuit element, which comprises the steps of:

forming a multiplicity of trenches in a substrate;

forming an outer conductive layer on lower regions of the trenches within the substrates defining first capacitor plates;

forming dielectric layers in the trenches, defining capacitor dielectrics;

forming an inner conductive layer in the trenches, defining second capacitor plates;

producing a multiplicity of insulating regions in contact with one another on wall sections of the trenches above the outer conductive layer;

removing the insulating regions at least in some of the trenches in order to expose the conductive layer; and filling exposed trenches with a conductive filler material.

9. The method according to claim 8, which further comprises forming a conductive bridge above the insulating regions on the coductive filler material.

* * * * *